United States Patent
Chen et al.

(10) Patent No.: US 9,087,780 B2
(45) Date of Patent: Jul. 21, 2015

(54) SEMICONDUCTOR PACKAGE AND METHOD OF FABRICATING THE SAME

(71) Applicant: Siliconware Precision Industries Co., Ltd., Taichung (TW)

(72) Inventors: Wan-Ting Chen, Taichung Hsien (TW); Mu-Hsuan Chan, Taichung Hsien (TW); Yi-Chian Liao, Taichung Hsien (TW); Chun-Tang Lin, Taichung Hsien (TW); Yi-Che Lai, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/872,468

(22) Filed: Apr. 29, 2013

(65) Prior Publication Data

US 2014/0027926 A1 Jan. 30, 2014

(30) Foreign Application Priority Data

Jul. 26, 2012 (TW) ............................ 101126923 A

(51) Int. Cl.
*H01L 23/48* (2006.01)
*H01L 23/28* (2006.01)
(Continued)

(52) U.S. Cl.
CPC ................ *H01L 23/28* (2013.01); *H01L 21/56* (2013.01); *H01L 23/31* (2013.01); *H01L 23/49827* (2013.01); *H01L 23/49833* (2013.01); *H01L 23/5384* (2013.01); *H01L 24/94* (2013.01); *H01L 24/96* (2013.01); *H01L 24/97* (2013.01); *H01L 21/565* (2013.01); *H01L 23/3121* (2013.01); *H01L 2224/0401* (2013.01); *H01L 2224/06181* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2924/10253* (2013.01); *H01L 2924/157* (2013.01); *H01L 2924/15788* (2013.01); *H01L 2924/3511* (2013.01); *H01L 2924/3512* (2013.01)

(58) Field of Classification Search
CPC ..... H01L 23/28; H01L 23/31; H01L 23/3185; H01L 23/5384; H01L 21/563; H01L 21/78; H01L 2225/06541
USPC ................... 257/774, 773, 730; 438/113, 114
See application file for complete search history.

(56) References Cited

U.S. PATENT DOCUMENTS

2012/0104623 A1* 5/2012 Pagaila et al. ................. 257/774
2012/0146209 A1* 6/2012 Hu et al. ....................... 257/692

*Primary Examiner* — Tu-Tu Ho
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, including: a carrier; at least an interposer disposed on the carrier; an encapsulant formed on the carrier for encapsulating the interposer while exposing a top side of the interposer; a semiconductor element disposed on the top side of the interposer; and an adhesive formed between the interposer and the semiconductor element. By encapsulating the interposer with the encapsulant, warpage of the interposer is avoided and a planar surface is provided for the semiconductor element to be disposed thereon, thereby improving the reliability of electrical connection between the interposer and the semiconductor element.

8 Claims, 3 Drawing Sheets

(51) Int. Cl.
*H01L 21/56* (2006.01)
*H01L 23/538* (2006.01)
*H01L 23/31* (2006.01)
*H01L 23/00* (2006.01)
*H01L 23/498* (2006.01)

SEMICONDUCTOR PACKAGE AND METHOD OF FABRICATING THE SAME

CROSS-REFERENCE TO RELATED APPLICATIONS

This application claims under 35 U.S.C. 0119(a) the benefit of Taiwanese Application No. 101126923, filed Jul. 26, 2012, the entire contents of which is incorporated herein by reference.

BACKGROUND OF THE INVENTION

1. Field of the Invention

The present invention relates to semiconductor packages and methods of fabricating the same, and, more particularly, to a semiconductor package having through silicon vias (TSVs) and a method of fabricating the same.

2. Description of Related Art

Flip-chip technologies facilitate the reduction of chip packaging sizes and signal transmission paths, and therefore are widely used for chip packaging. Various types of packages, such as chip scale packages (CSPs), direct chip attached (DCA) packages and multi-chip module (MCM) packages, can be achieved through flip-chip technologies.

In a flip-chip packaging process, a significant coefficient of thermal expansion (CTE) mismatch between a chip and a packaging substrate adversely affects the formation of joints between conductive bumps of the chip and contacts of the packaging substrate, thus easily resulting in delamination of the conductive bumps from the packaging substrate. On the other hand, along with increased integration of integrated circuits, a CIE mismatch between a chip and a packaging substrate induces more thermal stresses and leads to more serious warpage, thereby reducing the product reliability and resulting in failure of a reliability test.

Accordingly, semiconductor interposers have been developed to overcome the above-described drawbacks. FIG. 1 shows a semiconductor package 1 with a silicon interposer 11 provided between a packaging substrate 10 and a semiconductor chip 15. Since the interposer 11 and the semiconductor chip 15 are made of similar materials, the problem of CTE mismatch is overcome.

To form the semiconductor package 1, a wafer is provided with a plurality of TSVs 110 formed therein. A redistribution layer (RDL) structure 111 is formed on one side of the wafer, and a plurality of conductive bumps 12 are formed on the opposite side of the wafer. Subsequently, the wafer is singulated into a plurality of silicon interposers 11. Each of the silicon interposers 11 is disposed on a packaging substrate 10 through the conductive bumps 12, and an underfill 14 is filled between the silicon interposer 11 and the packaging substrate 10 for encapsulating the conductive bumps 12. Thereafter, a semiconductor chip 15 is disposed on and electrically connected to the RDL structure 111 through a plurality of solder bumps 150, and an underfill 16 is filled between the silicon interposer 11 and the semiconductor chip 15 for encapsulating the solder bumps 150. Finally, a plurality of solder balls 13 are formed on a bottom side of the packaging substrate 10 for a circuit board to be disposed thereon.

In the semiconductor package 1, the silicon interposer 11 has a small thickness. When a reflow process is performed to the conductive bumps 12 or the solder bumps 150 so as for the silicon interposer 11 to be bonded with the packaging substrate 10 or the semiconductor chip 15, warpage can easily occur to the silicon interposer 11, thereby reducing the planarity of the surface of the silicon interposer 11. As such, before or after the semiconductor chip 15 is disposed on the interposer 11, cracking of the solder bumps 150 or the conductive bumps 12 can easily occur, thus reducing the reliability of electrical connection.

Further, two underfilling processes need to be performed for each of the silicon interposers 11 so as to form the underfill 14 between the silicon interposer 11 and the packaging substrate 10 and form the underfill 16 between the silicon interposer 11 and the semiconductor chip 15. Therefore, the process time is significantly increased, which does not facilitate mass production.

Furthermore, if the silicon interposer 11 has a small thickness (for example, 4 mil), the underfill 14, when being formed between the interposer 11 and the packaging substrate 10, can easily creep up to contaminate the RDL structure 111, thereby easily resulting in an electrical connection failure between the RDL structure 111 and the semiconductor chip 15.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a carrier; at least an interposer having opposite first and second sides and disposed on the carrier through the first side thereof; an encapsulant formed on the carrier for encapsulating the interposer, the encapsulant having a side flush with a side of the encapsulant; a semiconductor element disposed on the second side of the interposer; and an adhesive formed between the second side of the interposer and the semiconductor element.

In an embodiment, the interposer is a substrate body made of a silicon-containing material.

The present invention further provides a method of fabricating a semiconductor package, comprising: disposing a plurality of interposers on a carrier, wherein each of the interposers has opposite first and second sides and is disposed on the carrier through the first side thereof; forming an encapsulant on the carrier to encapsulate the interposers, wherein the second sides of the interposers are exposed from the encapsulant; disposing a semiconductor element on the second side of each of the interposers; and performing a singulation process to obtain a plurality of semiconductor packages.

In an embodiment, forming an encapsulant comprises forming a protection film on the second sides of the interposers; forming the encapsulant through a mold; and removing the mold and the protection film.

In an embodiment, forming an encapsulant comprises providing a mold having a plurality of cover portions; disposing the carrier and the interposers in the mold with the cover portions abutting against the second sides of the interposers; injecting the encapsulant into the mold to encapsulate the interposers; and removing the mold.

In an embodiment, the method further comprises forming an adhesive between the semiconductor element and the second side of the corresponding interposer.

In an embodiment, the second side of the interposer is flush with a surface of the encapsulant.

In an embodiment, the carrier is a packaging substrate.

In an embodiment, the semiconductor element is electrically connected to the interposer.

In an embodiment, the interposer has a plurality of conductive through holes communicating the first and second sides thereof. In an embodiment, the conductive through holes are electrically connected to the carrier. In an embodiment, a redistribution layer (RDL) structure is formed at the second side of the interposer for electrically connecting the conductive through holes and the semiconductor element.

According to the present invention, an encapsulant is formed on the carrier to fix the interposers so as to prevent warpage of the interposers and therefore prevent cracking of conductive bumps between the interposers and the semiconductor elements caused by warpage of the interposers, thus improving the reliability of electrical conductivity. Further, by replacing the conventional underfilling process with a molding process, the present invention overcomes the conventional drawback of creeping of an underfill.

Furthermore, the encapsulant isolates the interposers from external environment so as to avoid cracking.

In addition, only one molding process is needed to form the encapsulant encapsulating all the interposers, thereby eliminating the need to repeat the underfilling process for each of the interposers as in the prior art and hence greatly reducing the fabrication time.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms, such as "upper", "lower", "first", "second", "a" etc., are merely for illustrative purpose and should not be construed to limit the scope of the present invention.

FIGS. 2A to 2F are cross-sectional views showing a method of fabricating a semiconductor package 2 according to the present invention.

Figure 1:
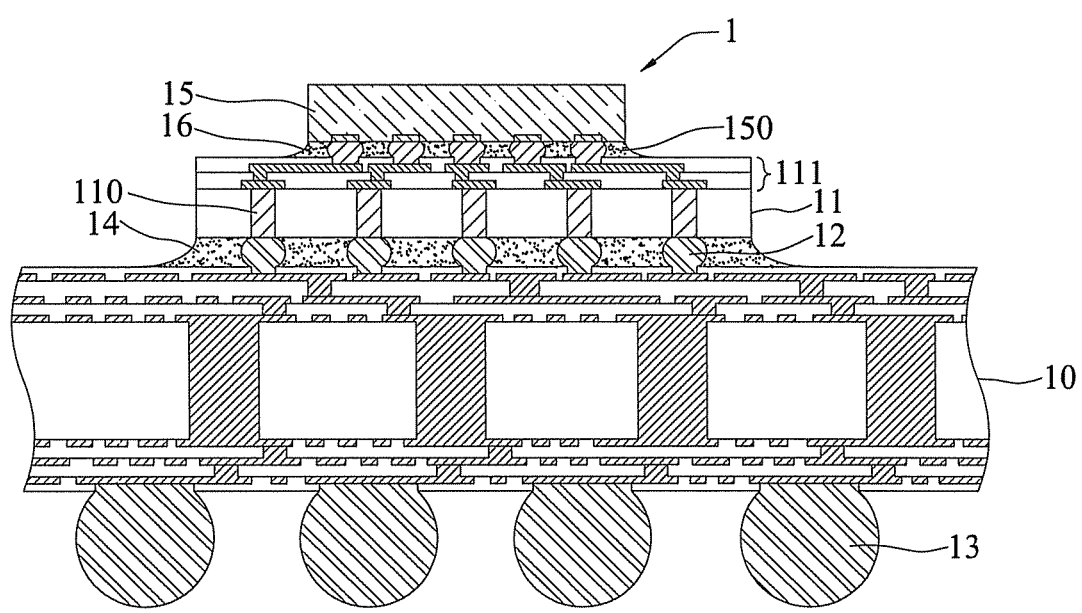
FIG. 1 is a cross-sectional view of a conventional semiconductor package.
Figure 2A:
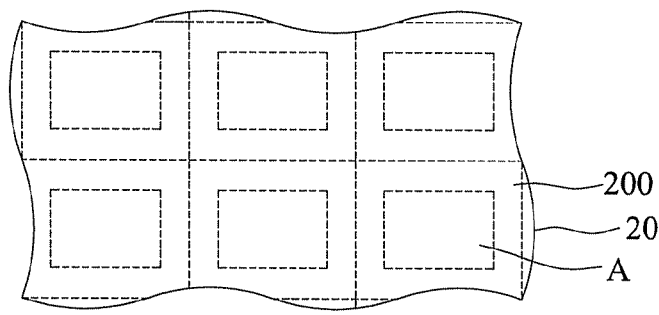
FIGS. 2A to 2F are cross-sectional views showing a method of fabricating a semiconductor package according to the present invention, wherein FIG. 2B' is a partially enlarged view of FIG. 2B, and FIG. 2D' shows another embodiment of FIG. 2C.

Referring to FIG. 2A, a carrier 20 having a plurality of packaging substrates 200 is provided, and each of the packaging substrates 200 has an attach area A. It should be noted that the packaging substrates 200 can have various structures without any special limitation.

Figure 2B:
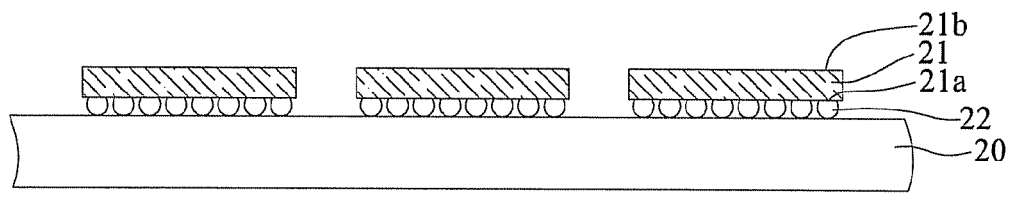
Figure 2B:
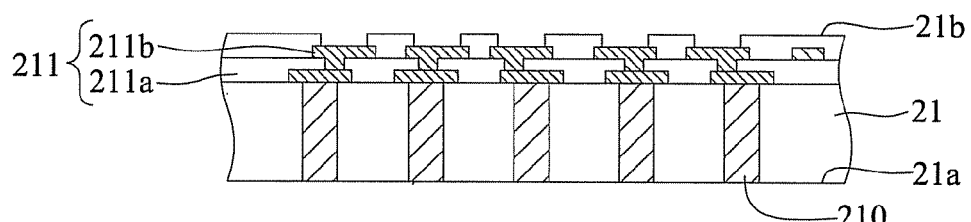

Referring to FIG. 2B, a plurality of interposers 21 are disposed on the attach areas A and electrically connected to the packaging substrates 200 through a plurality of conductive bumps 22. Each of the interposers 21 has a first side 21a and a second side 21b opposite to the first side 21a, and is disposed on the carrier 20 through the first side 21a thereof.

In an embodiment, referring to FIG. 2B', a plurality of conductive through holes 210 are formed in the interposer 21, and each of the conductive through holes 210 has one end extending to the first side 21a and the other end electrically connected to an RDL structure 211 formed at the second side 21b of the interposer 21.

The RDL structure 211 has at least a dielectric layer 211a and a plurality of circuit layers 211b stacked on one another.

In an embodiment, the interposer 21 is a substrate body made of a silicon-containing material, such as a semiconductor chip, a wafer or glass.

Figure 2C:
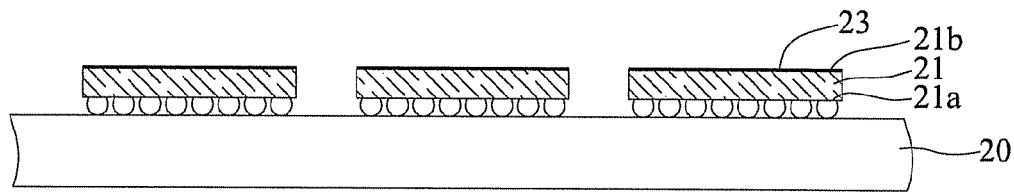

Referring to FIG. 2C, a protection film 23 is formed on the second side 21b of each of the interposers 21, and then the interposers 21 and the carrier 20 are disposed in a mold (not shown).

Figure 2D:
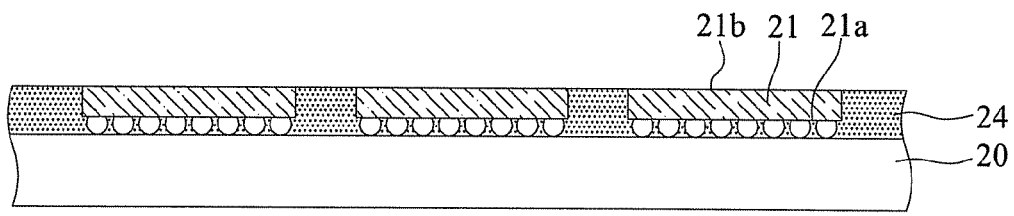
Figure 2D:
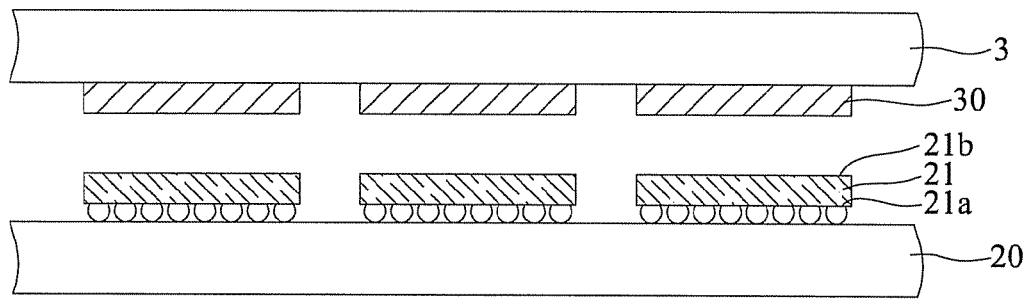

Referring to FIG. 2D, an encapsulant 24 is formed on the carrier 20 to encapsulate the interposers 21 and the conductive bumps 22. Thereafter, the mold is removed, and then the protection film 23 is also removed, so as to expose the second sides 2 lb of the interposers 21 from the encapsulant 24.

In an embodiment, the protection film 23 prevents the second sides 21b of the interposers 21 from being covered by the encapsulant 24. Further, the second sides 21b of the interposers 21 are flush with the surface of the encapsulant 24. In an embodiment, the protection film 23 is removed by UV, chemical solution or heating.

Further, the protection film 23 can be bonded with the mold so as to be removed together with the mold.

Referring to FIG. 2D', in another embodiment, the protection film 23 is not formed. Instead, a mold having an upper cover 3 with a plurality of cover portions 3 is provided. The interposers 21 and the carrier 20 are disposed in the mold so as for the cover portions 30 to abut against the second sides 21b of the interposers 21. That is, the second sides 21b of the interposers 21 are fully covered by the cover portions 30. Then, an encapsulant 24 is injected into the mold to encapsulate the interposers 21. Thereafter, the mold is removed.

By performing a molding process to form the encapsulant 24 instead of performing an underfilling process, the present invention prevents creeping of an underfill as in the prior art. Further, the protection film 23 or the cover portions 30 prevent the RDL structure 211 from being covered by the encapsulant 24 so as to ensure an effective electrical connection between the RDL structure 211 and an electronic device to be subsequently disposed thereon.

Figure 2E:
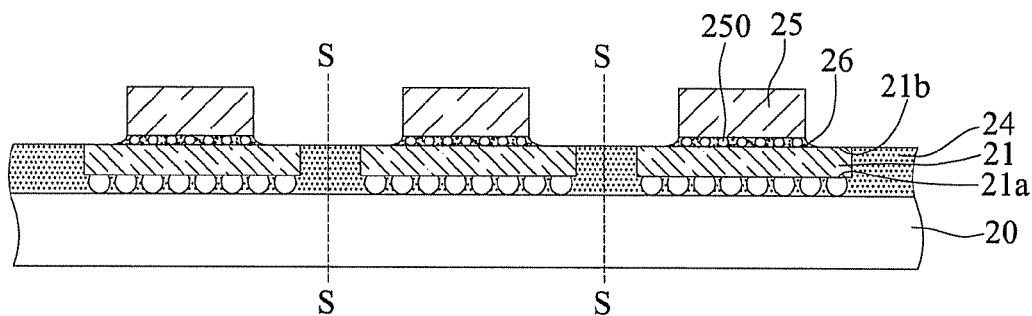

Referring to FIG. 2E, a semiconductor element 25 is disposed on the second side 21b of each of the interposers 21 in a flip-chip manner and electrically connected to the RDL structure 211 of the interposer 21 through a plurality of conductive bumps 250. Alternatively, the semiconductor element 25 can be disposed on the second side 21b of the interposer 21 through a non-active surface thereof and electrically connected to the second side 21b of the interposer 21 through a plurality of bonding wires.

Then, an adhesive 26 serving as an underfill is formed between the semiconductor element 25 and the second side 21b of the interposer 21 so as to encapsulate the conductive bumps 250. If the semiconductor element 25 is disposed on the interposer 21 through the inactive surface thereof, the adhesive 26 can be formed between the inactive surface of the semiconductor element 25 and the interposer 21 so as to attach the semiconductor element 25 to the interposer 21.

Figure 2F:
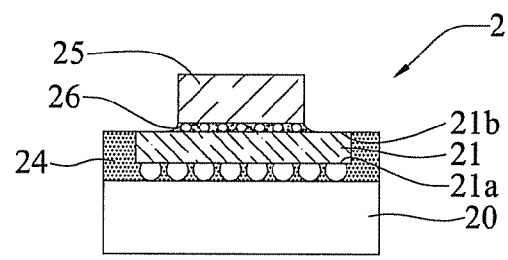

Referring to FIG. 2F, a singulation process is performed along cutting lines S of FIG. 2E so as to obtain a plurality of semiconductor packages 2.

Therefore, by forming the encapsulant 24 to encapsulate the interposers 21, the present invention prevents warpage of the interposers 21. Further, the encapsulant 24 protects the interposers 21 from external environment so as to avoid cracking.

Further, since the second sides 21b of the interposers 21 are flush with the surface of the encapsulant 24, the present invention provides a planar surface for the semiconductor elements 25 to be disposed thereon, thereby preventing cracking of the conductive bumps 250 when the semiconductor elements 25 are disposed on interposers 21 and hence improving the reliability of electrical connection.

Furthermore, only through one molding process, the encapsulant 24 is formed to fix all the interposers 21 on the carrier 20, thereby eliminating the need to repeat the underfilling process for each of the interposers as in the prior art and hence greatly reducing the fabrication time.

The present invention further provides a semiconductor package 2, which has: a carrier 20; an interposer 21 disposed on the carrier 20; an encapsulant 24 formed on the carrier 20 for encapsulating the interposer 21; a semiconductor element 25 disposed on the interposer 21; and an adhesive 26 formed between the interposer 21 and the semiconductor element 25.

The carrier 20 is a packaging substrate 200.

The interposer 21 has a first side 21a and a second side 21b opposite to the first side 21a, and is disposed on the carrier 20 through the first side 21a. Further, the interposer 21 has a plurality of conductive through holes 210 communicating the first side 21a and the second side 21b and electrically connected to the carrier 20. The interposer 21 further has an RDL structure 211 formed at the second side 21b thereof and electrically connecting the conductive through holes 210.

The second side 21b of the interposer 21 is exposed from the encapsulant 24. Preferably, the second side 21b of the interposer 21 is flush with the surface of the encapsulant 24.

The semiconductor element 25 is disposed on the second side 21b of the interposer 21 and electrically connected to the RDL structure 211.

The adhesive 26 is formed between the semiconductor element 25 and the second side 21b of the interposer 21.

According to the present invention, an encapsulant is formed on the carrier to encapsulant the interposers so as to prevent warpage of the interposers. Therefore, a planar surface can be provided for disposing the semiconductor elements, thereby preventing cracking of the conductive bumps between the interposers and the semiconductor elements caused by warpage of the interposers, thus improving the reliability of electrical conductivity.

Further, through the single molding process, an encapsulant can be formed to fix all the interposers, thereby greatly reducing the process time.

In addition, by eliminating the need to perform the conventional underfilling process at the first sides of the interposers, the present invention overcomes the conventional drawback of creeping of an underfill.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
a carrier;
at least an interposer having opposite first and second sides and disposed on the carrier through the first side thereof;
an encapsulant formed on the carrier for encapsulating the interposer, the encapsulant having a side flush with a side of the interposer, wherein the encapsulant integrally exposes the second side of the interposer;
a semiconductor element disposed on the second side of the interposer; and
an adhesive formed between the second side of the interposer and the semiconductor element.

2. The semiconductor package of claim 1, wherein the carrier is a packaging substrate.

3. The semiconductor package of claim 1, further comprising a plurality of conductive through holes formed in the interposer to communicate the first and second sides of the interposer.

4. The semiconductor package of claim 3, wherein the conductive through holes are electrically connected to the carrier.

5. The semiconductor package of claim 3, further comprising a redistribution layer (RDL) structure formed at the second side of the interposer for electrically connecting the conductive through holes and the semiconductor element.

6. The semiconductor package of claim 1, wherein the second side of the interposer is flush with a surface of the encapsulant.

7. The semiconductor package of claim 1, wherein the semiconductor element is electrically connected to the interposer.

8. The semiconductor package of claim 1, wherein the interposer is a substrate body made of a silicon-containing material.

* * * * *